(12) United States Patent
Shih et al.

(10) Patent No.: US 7,863,132 B2
(45) Date of Patent: Jan. 4, 2011

(54) METHOD FOR FABRICATING A CHARGE TRAPPING MEMORY DEVICE

(75) Inventors: Yen-Hao Shih, Banqiao (TW); Chi-Pin Lu, Hsinchu (TW); Jung-Yu Hsieh, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 7 days.

(21) Appl. No.: 11/425,160

(22) Filed: Jun. 20, 2006

(65) Prior Publication Data

US 2007/0293006 A1 Dec. 20, 2007

(51) Int. Cl.
  *H01L 21/336* (2006.01)
(52) U.S. Cl. ........................ 438/257; 257/314
(58) Field of Classification Search ................ 438/257
  See application file for complete search history.

(56) References Cited

U.S. PATENT DOCUMENTS

| | | | |
|---|---|---|---|
| 5,403,786 A * | 4/1995 | Hori ........................... | 438/585 |
| 6,534,388 B1 * | 3/2003 | Lin et al. ..................... | 438/510 |
| 6,989,561 B2 * | 1/2006 | Lin et al. ..................... | 257/301 |
| 2002/0132416 A1 * | 9/2002 | Gamo et al. ................. | 438/216 |
| 2003/0168705 A1 * | 9/2003 | Tanida et al. ................ | 257/410 |
| 2005/0032308 A1 * | 2/2005 | Hsiao et al. ................. | 438/257 |
| 2005/0148173 A1 * | 7/2005 | Shone ......................... | 438/672 |
| 2006/0281255 A1 * | 12/2006 | Chiu et al. .................. | 438/257 |

* cited by examiner

*Primary Examiner*—Thanh V Pham
*Assistant Examiner*—Tony Tran
(74) *Attorney, Agent, or Firm*—Thomas, Kayden, Horstemeyer & Risley

(57) ABSTRACT

A method for fabricating a charge trapping memory device includes providing a substrate; forming a first oxide layer on the substrate; forming a number of BD regions in the substrate; nitridizing the interface of the first oxide layer and the substrate via a process; forming a charge trapping layer on the first oxide layer; and forming a second oxide layer on the charge trapping layer.

26 Claims, 10 Drawing Sheets

| Cycle<br>Item | 0 | 1 | 10 | 100 | 1K | 10K | 100K |
|---|---|---|---|---|---|---|---|
| $S_W$ (inv/dec) | 229.5 | 235.1 | 252.5 | 256 | 267 | 323.4 | 427 |
| $Q_{IT}$ (coul/cm$^2$) | 0 | 4.5E-9 | 1.8E-8 | 2.1E-8 | 2E-8 | 7.5E-8 | 1.6E-7 |
| $V_T$ by $Q_{IT}$(%) | 0 | 1.18 | 4.88 | 5.62 | 7.95 | 19.89 | 41.9 |

FIG. 1F (PRIOR ART)

METHOD FOR FABRICATING A CHARGE TRAPPING MEMORY DEVICE

BACKGROUND OF THE INVENTION

1. Field of the Invention

The invention relates in general to a method for fabricating a memory device, and more particularly to a method for fabricating a charge trapping memory device.

2. Description of the Related Art

In the process of fabricating a charge trapping memory device, such as a nitride charge storage device, a bottom oxide layer (BOX) is formed on a silicon (Si) substrate, and Si—O bonds are generated at the interface of the bottom oxide layer and silicon substrate as shown in FIG. 1A. Subsequently, a buried diffusion (BD) implantation is performed through the first oxide layer to form BD regions in the substrate. After the BD implantation, a lot of silicon dangling bonds are generated at the BOX/Si interface as shown in FIG. 1B. Afterwards, in a low-temperature metallization process, hydrogen (H) is introduced to form Si—H bonds at the BOX/Si interface as shown in FIG. 1C. Therefore, when the band-to-band tunneling hot hole (BTBT-HH) erase is performed on the nitride charge storage device 100 as shown in FIG. 1D, Si—H bonds at the BOX/Si interface are broken by hot holes (energy carried is about 4.7 eV), and an interface trap is generated at the interface of the BOX and the channel to carry negative charges $Q_{IT}$.

Referring to FIG. 1E, an I-V curve diagram of the device 100 is shown. Initially, there is no program-erase operation on the device 100, and the device 100 has an I-V curve C1. After program, the device 100 increases its threshold voltage $V_T$ to have an I-V curve C2. In a reliability test, the programmed device 100 is baked at a temperature of 150□ for about 24 hours to have an I-V curve C3. It can be seen from FIG. 1E that the I-V curve C3 after baking is very similar to the I-V curve C2 before baking, and thus the initial device 100 is stable. However, when the device 100 is programmed and erased by 10K cycles, the 10K-cycle programmed device 100 changes to have an I-V curve C4 whose slope is smaller than the curve C2 due to appearance of large amount of charges $Q_{IT}$. When the 10K-cycle programmed device 100 is baked for reliability test, the device 100 turns up to have a new I-V curve C5 whose threshold voltage $V_T$ is smaller than that $V_T$ of the curve C2 for an initial state by a value $\Delta V_T$.

As shown in FIG. 1F, when the cycle number of erase-program is increased, such as from 0 to 100K, the device 100 has an increasing sub-threshold swing $S_W$, such as from 229.5 to 427 mV/dec due to the generation of the charges $Q_{IT}$ at the BOX/Si interface whose density is increased from 0 to 1.6E–7coul/cm², and the $V_T$ difference between program and erase state contributed by $Q_{IT}$ is also increased from 0 to 41.9%. Therefore, the interface trap generation leads to $S_W$ degradation and thus reduces reliability of nitride charge storage products.

SUMMARY OF THE INVENTION

It is therefore an object of the invention to provide a method for fabricating a charge trapping memory device. A rapid thermal nitridation (RTIN) process is performed on the BOX layer and silicon substrate after BD implantation to form Si—N bonds at the BOX/Si interface. Therefore, the interface trap generation can be suppressed in a subsequent process, thereby improving reliability of the charge trapping memory device.

The invention achieves the above-identified object by providing a method for fabricating a charge trapping memory device. The method includes providing a substrate; forming a first oxide layer on the substrate; forming a number of BD regions in the substrate; nitridizing the interface of the first oxide layer and the substrate via a process; forming a charge trapping layer on the first oxide layer; and forming a second oxide layer on the charge trapping layer.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIG. 1F is a comparison table of the sub-threshold swing $S_W$, the density of charges $Q_{IT}$, and the $V_T$ difference by $Q_{IT}$ of a conventional nitride charge storage device for various erase-program cycle number.

DETAILED DESCRIPTION OF THE INVENTION

Figure 2A:
FIG. 2A to FIG. 2J are a process for fabricating a charge trapping memory device according to a preferred embodiment of the invention.
Figure 2B:
Figure 2C:
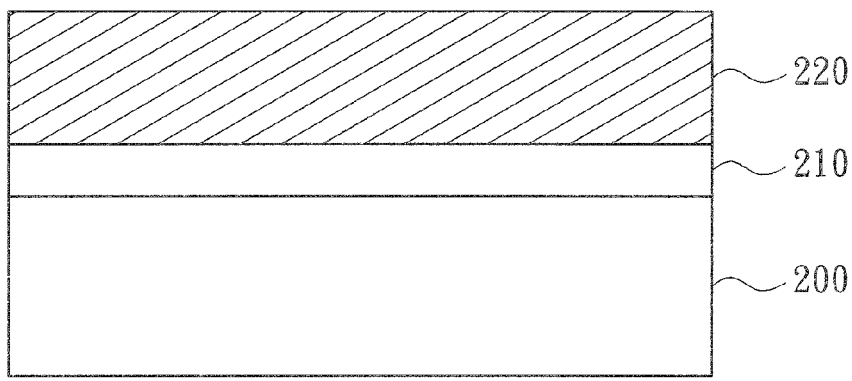
Figure 2D:
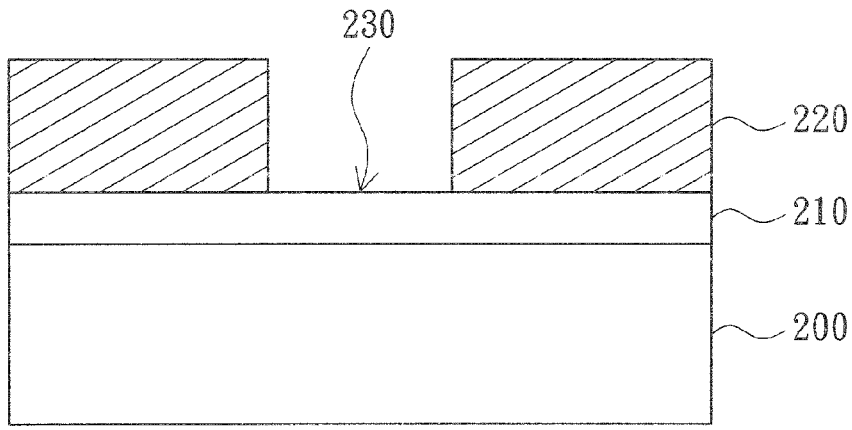
Figure 2E:
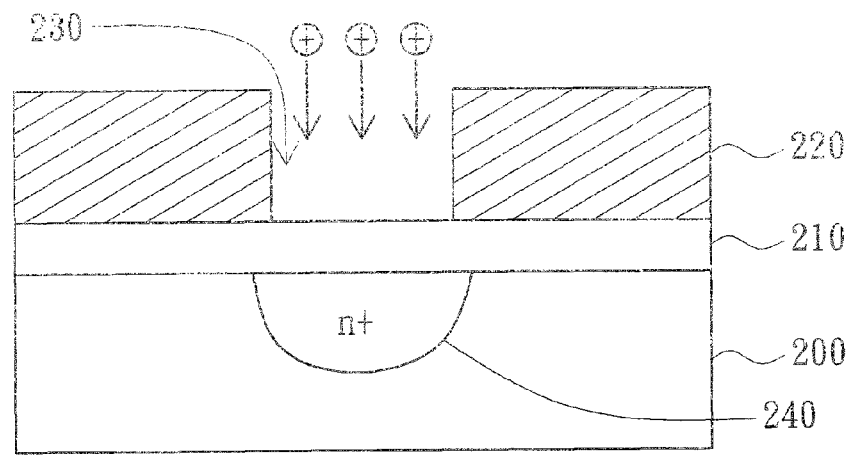

Referring to FIG. 2A to FIG. 2J, a process for fabricating a charge trapping memory device according to a preferred embodiment of the invention is shown. For example, the charge trapping memory device is a nitride charge storage device, which performs an erase operation by BTBT-HH. First, in FIG. 2A, a substrate 200, such as a P-type silicone substrate, is provided. Next, in FIG. 2B, a first oxide layer 210, such as made of silicone dioxide (SiO₂) is formed on the substrate 200. Then, in FIG. 2C, a photoresist layer 220 is formed on the first oxide layer 210 and in FIG. 2D, the photoresist layer 220 is exposed and etched to define a number of BD lines 230 on the first oxide layer 210. In FIG. 2C, only one BD line is shown for convenience of illustration. Following that, in FIG. 2E, a BD implantation is performed on the substrate 200 through the BD lines 230 to form a number of BD regions 240, such as n+ regions for bit lines (BL), in the substrate 200. Similarly, only one BD region 240 is shown in FIGS. 2E~2I for convenience of illustration. As mentioned in prior art, lots of silicone dangling bonds will be generated at the interface of the first oxide layer 210 adjacent to the BD region 240.

Figure 2F:
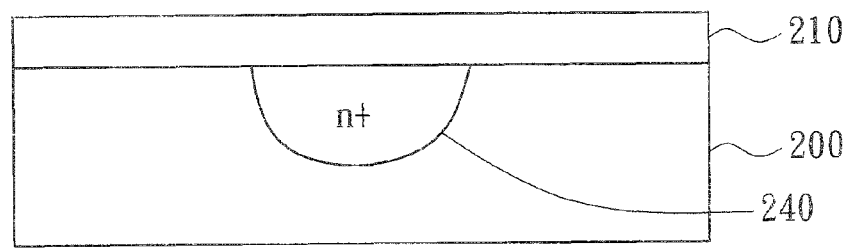
Figure 2G:
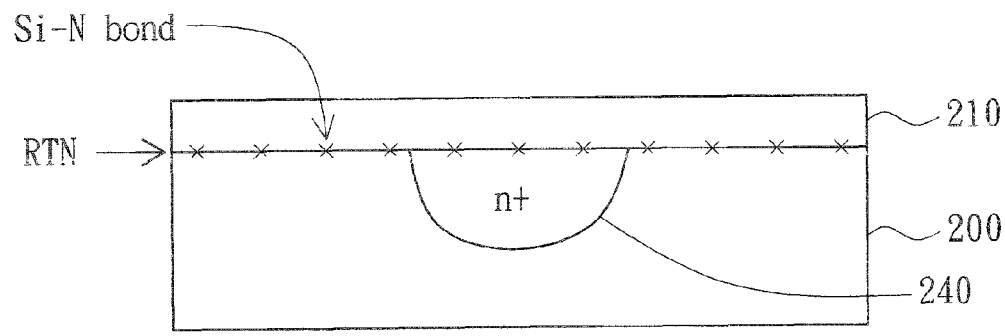
Figure 3:
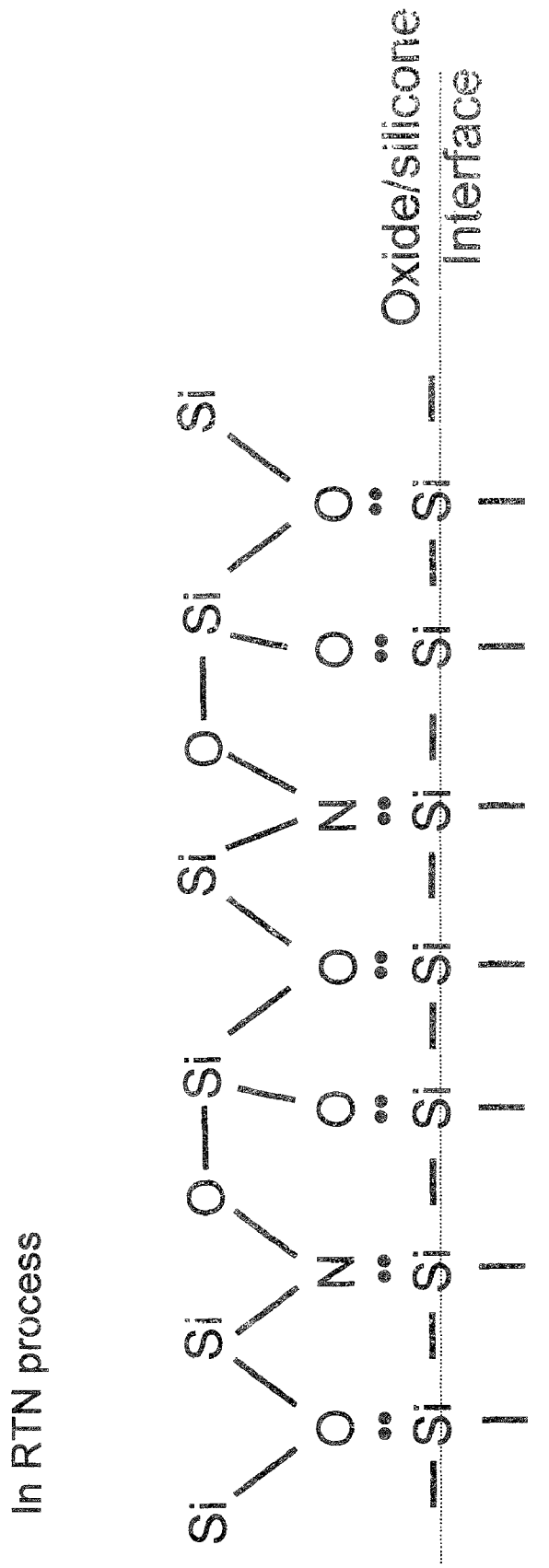
FIG. 3 is a diagram of an oxide/silicone interface with Si—N bonds.

Afterwards, in FIG. 2F, the etched photoresist layer 220 is stripped from the first oxide layer 210 by dry etching, wet etching, or ISSG method, and the first oxide layer 210 is further cleaned by a remote chemical analysis cleaning (RCA CLN) process (published by Kern and Puotinen in 1970) to completely remove photoresist residue. Next, in FIG. 2G, a RTN process is performed to nitridize the interface of the first oxide layer 210 and the substrate 200 such that the above-mentioned silicone dangling bonds can combine with nitrogen (N) to form strong Si—N bonds as shown in FIG. 3. For example, the RTN process is performed to nitridize the oxide/silicone interface by using NO, N2O or NH3 gas for at least 10 sec under a temperature of 750☐-1050☐. Preferably, the RTN process is performed for about 1 minute under a temperature of 975☐. Therefore, in the RTN process, the oxide/silicone interface has enough time to form the Si—N bonds under high temperature, and the heating time for the substrate 200 is not too long to expand the BD regions 240.

Figure 2H:
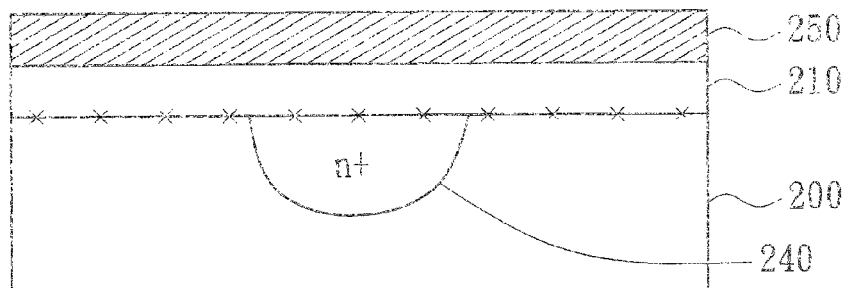
Figure 2I:
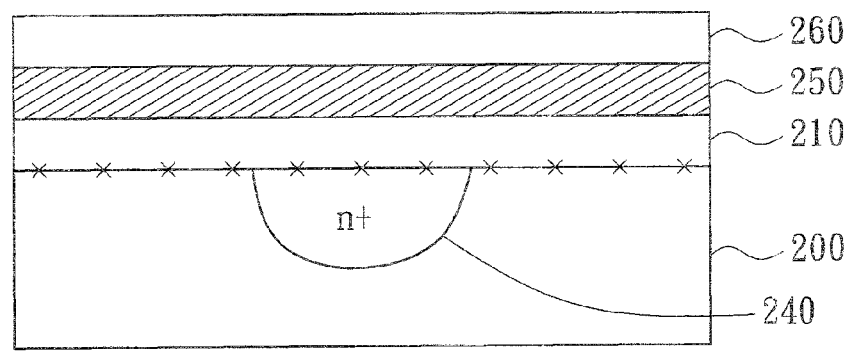

Following that, in FIG. 2H, a charge trapping layer 250, such as made of silicone nitride, hafnium oxide, or aluminum oxide, is formed on the first oxide layer 210, and in FIG. 2I, a second oxide layer 260, such as made of silicone dioxide, is formed on the charge trapping layer 250. Finally, a nitride charge storage device 200 is generated when a poly-silicone layer 270 for a gate (G) electrode is formed on the second oxide layer 260a, and a charge trapping memory device 200 is formed with a gate 270, a source 240, a drain 240, and an insulating stack of the layers 210, 250, 260 as shown in FIG. 2J.

Figure 2J:
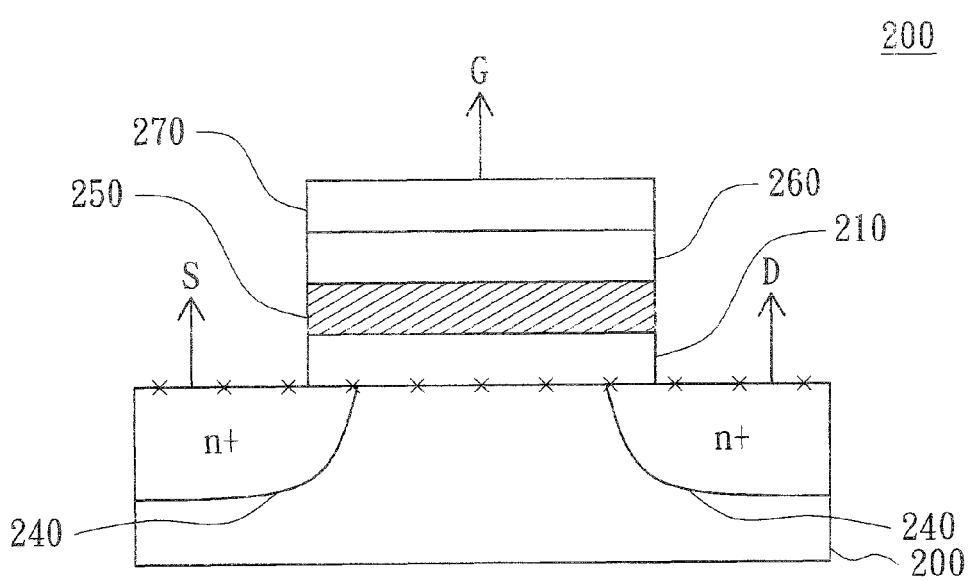

Owing that the strong Si—N bonds are formed at the oxide/silicone interface in the RTN process as shown in FIG. 3, when the BTBT-HH erase is performed on the nitride charge storage device 200 as shown in FIG. 2J, Si—N bonds at the oxide/silicone interface are scarcely broken by hot holes (energy carried is about 4.7 eV), and the prior-art interface trap generation can be effectively suppressed and thus reliability of the nitride charge storage device 200 can be higher than prior art.

Figure 1A:
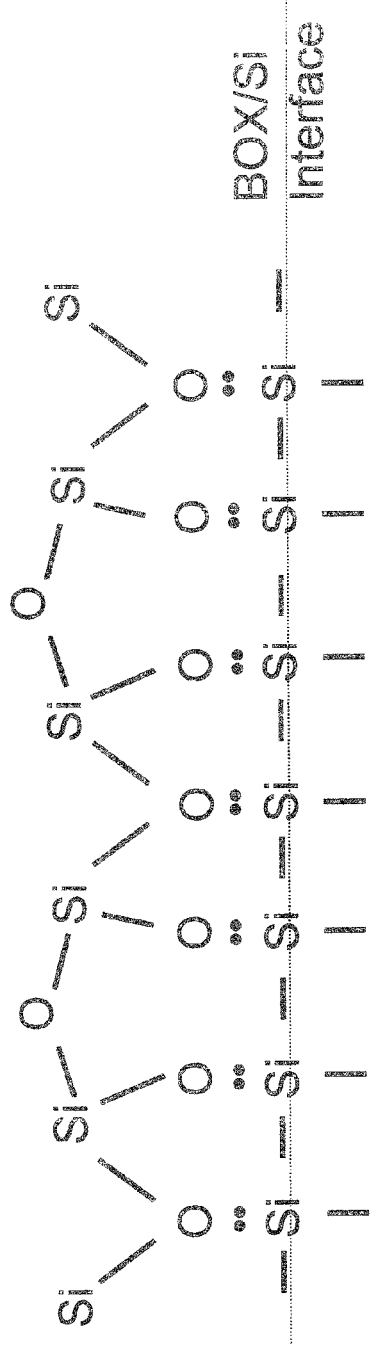
FIG. 1A is a diagram of a BOX/Si interface of a conventional nitride charge storage device in an initial process.
Figure 1B:
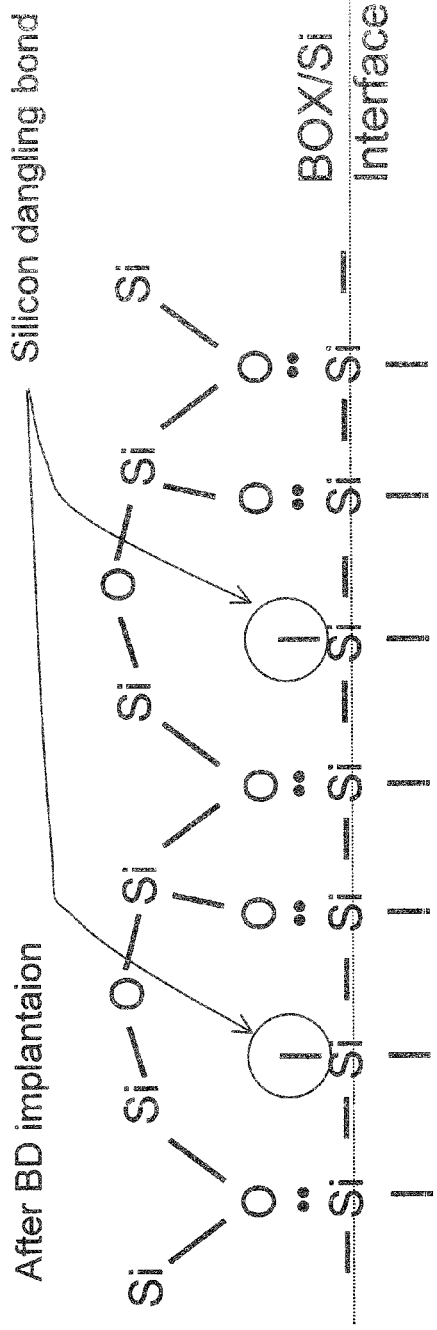
FIG. 1B is a diagram of a BOX/Si interface of a conventional nitride charge storage device after BD implantation.
Figure 1C:
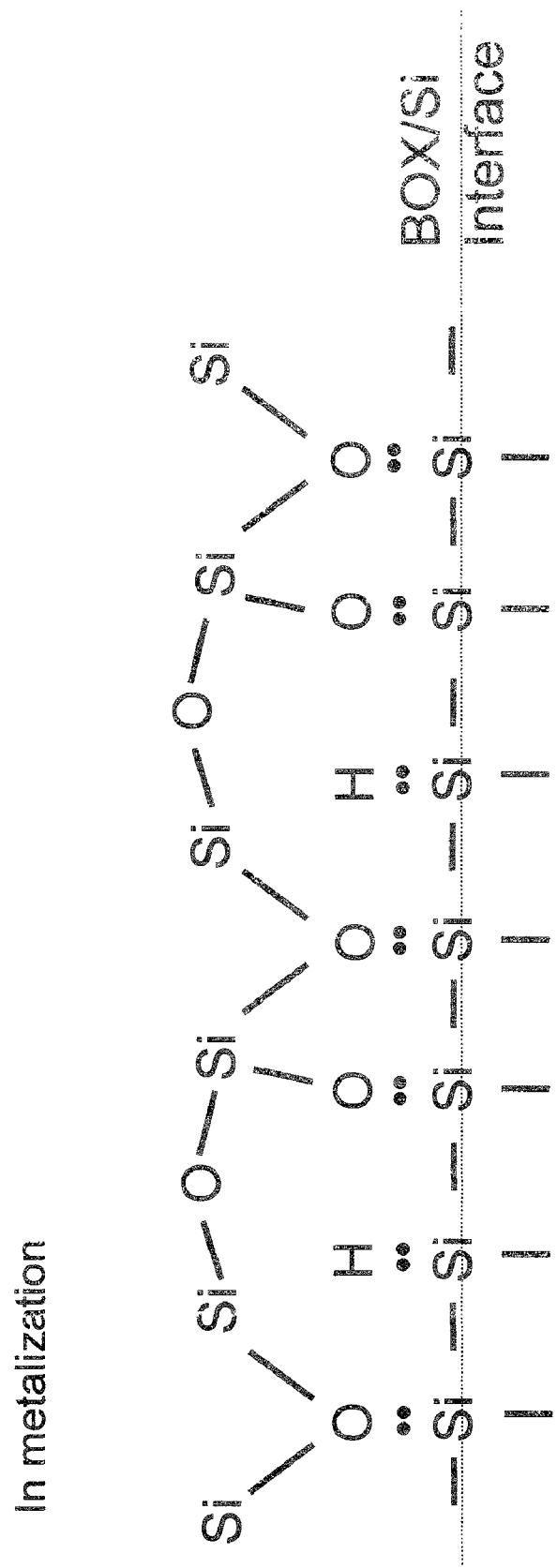
FIG. 1C is a diagram of a BOX/Si interface of a conventional nitride charge storage device in a metallization process.
Figure 1D:
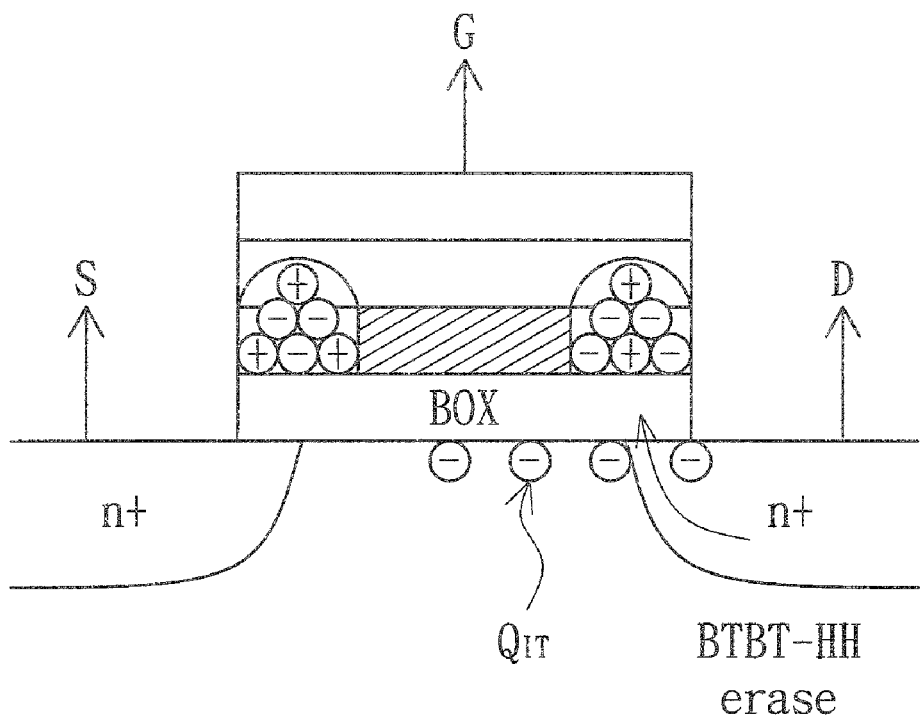
FIG. 1D is a diagram of the conventional nitride charge storage device forming interface trap.
Figure 1E:
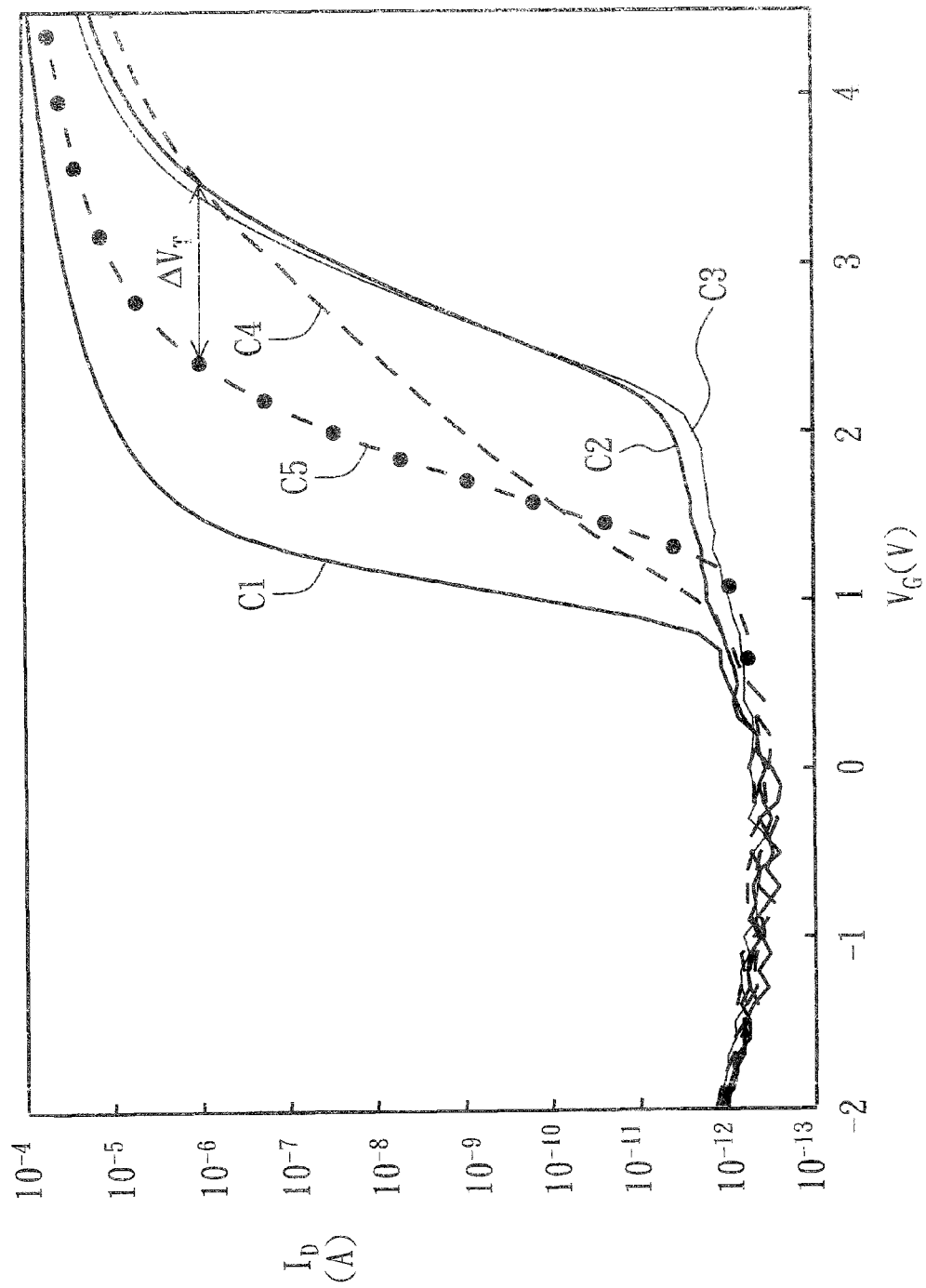
FIG. 1E is an I-V curve diagram of a conventional nitride charge storage device.
Figure 4:
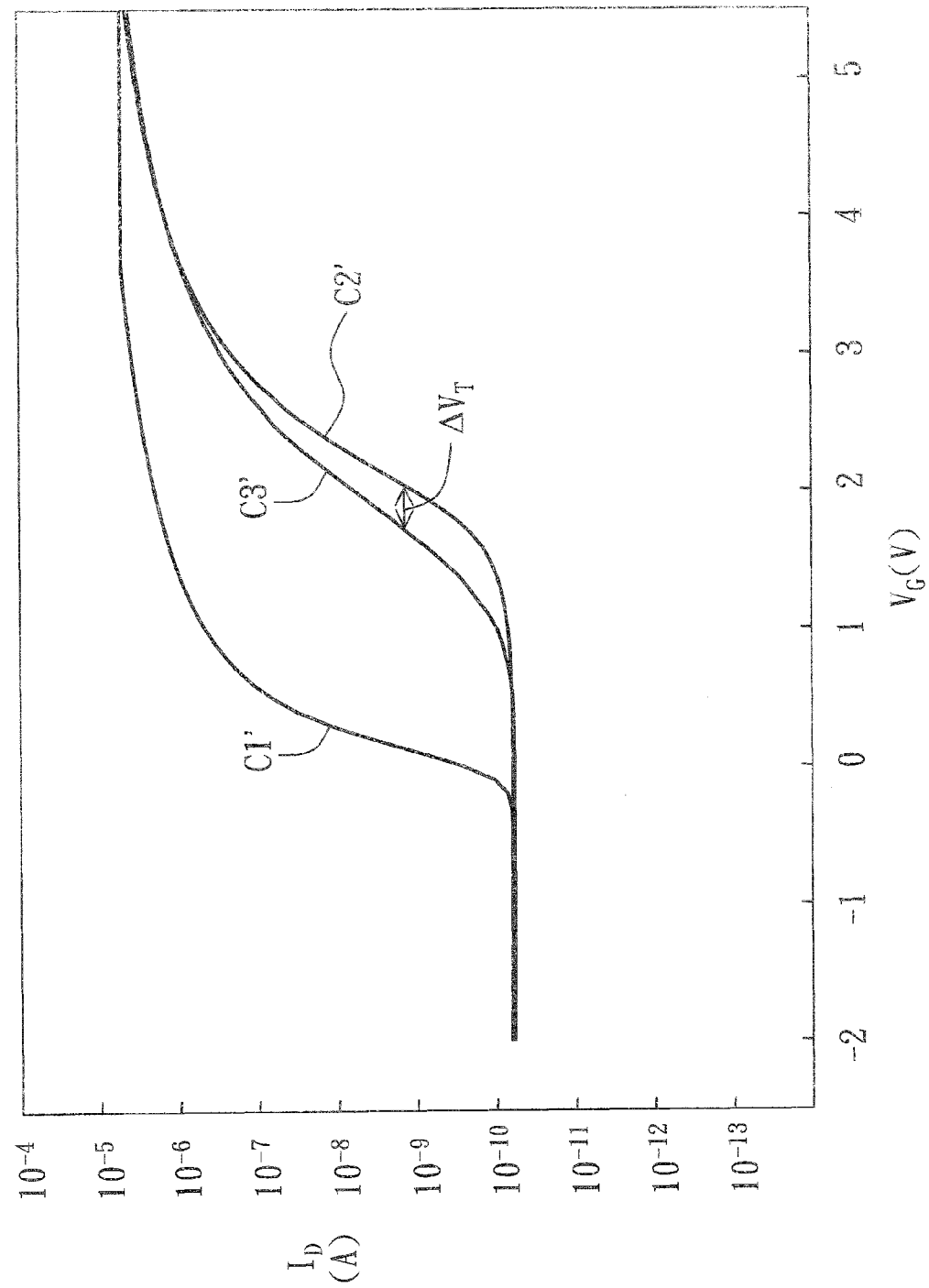
FIG. 4 is an I-V curve diagram of the nitride charge storage device in FIG. 2J.

Referring to FIG. 4, an I-V curve diagram of the nitride charge storage device 200 is shown. Initially, there is no program-erase operation on the nitride charge storage device 200, and the nitride charge storage device 200 has an I-V curve C1'. After programming the initial device, the nitride charge storage device 200 has an I-V curve C2', and after 10K cycles of erase and program, the programmed nitride charge storage device 200 increases its threshold voltage $V_T$ to have an I-V curve C3'. It can be seen from FIG. 4 that the I-V curve C3' has smaller SW degradation than that value of the prior-art curve C4 in FIG. 1E, and thus the RTN nitride charge storage device 200 can have higher reliability than the prior-art nitride charge storage device 100 after a number of erase-program cycles.

In the method for fabricating a charge trapping memory device disclosed by the above-mentioned embodiment of the invention, a RTN process is performed to nitridize the oxide/silicone interface after the BD implantation and form strong Si—N bonds at the interface. Therefore, the interface trap generated in BTBT-HH erase can be reduced and the reliability of the nitride charge storage device can be improved.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for fabricating a charge trapping memory device, comprising:
    providing a substrate;
    forming a first oxide layer on the substrate;
    forming a plurality of source/drain regions in the substrate;
    nitridizing an interface of the first oxide layer and the source/drain regions and an interface of the first oxide layer and a region of the substrate between the source/drain regions via a process after forming the source/drain regions in the substrate;
    forming a charge trapping layer on the first oxide layer;
    forming a second oxide layer on the charge trapping layer; and
    forming a conductive gate on the second oxide layer.

2. The method according to claim 1, wherein the step of forming a plurality of source/drain regions further comprises:
    forming a photoresist layer on the first oxide layer;
    exposing and etching the photoresist layer to define buried-diffusion (BD) lines on the first oxide layer;
    performing a BD implantation through the first oxide layer to form the plurality of source/drain regions in the substrate; and
    stripping the etched photoresist layer from the first oxide layer after forming the plurality of source/drain regions.

3. The method according to claim 2, wherein the step of stripping the etched photoresist layer further comprises:
    stripping the etched photoresist layer from the first oxide layer by dry etching, wet etching, or in-situ steam generation (ISSG) method; and
    performing a remote chemical analysis cleaning (RCA CLN) process on the first oxide layer.

4. The method according to claim 1, wherein the process is a rapid thermal nitridation (RTN) process.

5. The method according to claim 4, wherein the RTN process is performed at least 10 sec under a temperature of 750° C.~1050° C.

6. The method according to claim 4, wherein the RTN process is performed about 1 minute under a temperature of 975° C.

7. The method according to claim 4, wherein the RTN process is performed by using NO, N2O, or NH3 gas.

8. The method according to claim 7, wherein in the RTN process, Si—N bonds are formed at the interface of the first oxide layer and the substrate.

9. The method according to claim 1, wherein the substrate is a P-substrate and the source/drain regions are n+ regions for bit lines (BL).

10. The method according to claim 1, wherein the first oxide layer and the second oxide layer are made of silicone dioxide.

11. The method according to claim 1, wherein the charge trapping layer is made of silicone nitride, hafnium oxide, or aluminum oxide.

12. The method according to claim 1, wherein the charge trapping memory device is erased by band-band tunneling hot holes (BTBT HH).

13. The method according to claim 1, wherein the charge trapping memory device is a nitride charge storage device.

14. A method for fabricating a charge trapping memory device, comprising:
    providing a substrate;
    forming a first oxide layer on the substrate;
    forming a plurality of source/drain regions in the substrate, wherein each source/drain region comprises a plurality of dangling bonds;
    nitridizing an interface of the first oxide layer and the substrate having the source/drain regions to repair the dangling bonds via a process after forming the source/drain regions in the substrate;
    forming a charge trapping layer on the first oxide layer after nitridizing the interface of the first oxide layer and the substrate;

forming a second oxide layer on the charge trapping layer; and forming a conductive gate wherein the source/drain regions are formed before the conductive gate.

15. The method according to claim 14, wherein the step of forming a plurality of source/drain regions further comprises:
   forming a photoresist layer on the first oxide layer;
   exposing and etching the photoresist layer to define buried-diffusion (BD) lines on the first oxide layer;
   performing a BD implantation through the first oxide layer to form the plurality of source/drain regions in the substrate; and
   stripping the etched photoresist layer from the first oxide layer after forming the plurality of source/drain regions.

16. The method according to claim 15, wherein the step of stripping the etched photoresist layer further comprises:
   stripping the etched photoresist layer from the first oxide layer by dry etching, wet etching, or in-situ steam generation (ISSG) method; and
   performing a remote chemical analysis cleaning (RCA CLN) process on the first oxide layer.

17. The method according to claim 14, wherein the process is a rapid thermal nitridation (RTN) process.

18. The method according to claim 17, wherein the RTN process is performed at least 10 sec under a temperature of 750° C. ~1050° C.

19. The method according to claim 17, wherein the RTN process is performed about 1 minute under a temperature of 975° C.

20. The method according to claim 17, wherein the RTN process is performed by using NO, N2O, or NH3 gas.

21. The method according to claim 20, wherein in the RTN process, Si—N bonds are formed at the interface of the first oxide layer and the substrate.

22. The method according to claim 14, wherein the substrate is a P-substrate and the source/drain regions are n+ regions for bit lines (BL).

23. The method according to claim 14, wherein the first oxide layer and the second oxide layer are made of silicone dioxide.

24. The method according to claim 14, wherein the charge trapping layer is made of silicone nitride, hafnium oxide, or aluminum oxide.

25. The method according to claim 14, wherein the charge trapping memory device is erased by band-band tunneling hot holes (BTBT HH).

26. A method for fabricating a charge trapping memory device, comprising:
   providing a substrate;
   forming a first oxide layer on the substrate;
   forming a plurality of source/drain regions in the substrate;
   nitridizing an interface of the first oxide layer and the substrate having the source/drain regions via a process after forming the source/drain regions in the substrate;
   forming a charge trapping layer on the first oxide layer after forming the source/drain regions;
   forming a second oxide layer on the charge trapping layer; and
   forming a conductive gate on the second oxide layer.

* * * * *